(12) United States Patent
Fitzsimmons et al.

(10) Patent No.: US 7,480,990 B2
(45) Date of Patent: Jan. 27, 2009

(54) METHOD OF MAKING CONDUCTOR CONTACTS HAVING ENHANCED RELIABILITY

(75) Inventors: John A. Fitzsimmons, Poughkeepsie, NY (US); William J. Cote, Poughquag, NY (US); Nancy A. Greco, LaGrangeville, NY (US); Thomas H. Ivers, Hopewell Junction, NY (US); Steven Moskowitz, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 201 days.

(21) Appl. No.: 11/306,668

(22) Filed: Jan. 6, 2006

(65) Prior Publication Data

US 2007/0161290 A1    Jul. 12, 2007

(51) Int. Cl.
*H05K 3/02* (2006.01)
*H01L 21/302* (2006.01)

(52) U.S. Cl. .................. 29/846; 29/825; 29/852; 438/689; 438/745

(58) Field of Classification Search .............. 29/825, 29/846, 852; 438/689, 745
See application file for complete search history.

(56) References Cited

U.S. PATENT DOCUMENTS

| | | | |
|---|---|---|---|
| 6,358,842 B1 * | 3/2002 | Zhou et al. ............ | 438/633 |
| 6,455,409 B1 * | 9/2002 | Subramanian et al. ... | 438/618 |
| 6,485,988 B2 * | 11/2002 | Ma et al. ............ | 438/3 |
| 6,562,725 B2 | 5/2003 | Tsai et al. | |
| 6,627,968 B2 * | 9/2003 | Cheng et al. .......... | 257/529 |
| 6,753,260 B1 * | 6/2004 | Li et al. ............ | 438/700 |
| 6,803,289 B1 * | 10/2004 | Gopalan et al. ........ | 438/343 |
| 6,913,946 B2 * | 7/2005 | Lin ................. | 438/106 |
| 6,924,228 B2 * | 8/2005 | Kim et al. ........... | 438/636 |
| 6,974,770 B2 * | 12/2005 | Costrini et al. ....... | 438/637 |
| 7,008,871 B2 * | 3/2006 | Andricacos et al. .... | 438/652 |
| 7,022,600 B2 * | 4/2006 | Kim et al. ........... | 438/623 |
| 7,183,226 B2 * | 2/2007 | Lee et al. ............ | 438/749 |
| 7,192,864 B2 * | 3/2007 | Lee et al. ............ | 438/637 |
| 7,226,853 B2 * | 6/2007 | Bekiaris et al. ....... | 438/622 |
| 7,229,907 B2 * | 6/2007 | Wu et al. ............ | 438/618 |
| 2002/0140101 A1 * | 10/2002 | Yang et al. ........... | 257/762 |
| 2004/0171211 A1 * | 9/2004 | Lee et al. ............ | 438/243 |
| 2005/0287771 A1 * | 12/2005 | Seamons et al. ....... | 438/482 |
| 2006/0003574 A1 * | 1/2006 | Kim et al. ........... | 438/628 |

* cited by examiner

*Primary Examiner*—C. J Arbes
(74) *Attorney, Agent, or Firm*—Scully, Scott, Murphy & Presser, P.C.; H. Daniel Schnurmann

(57) ABSTRACT

Methods for forming conductor contacts provide for etching through a capping layer located upon a conductor contact region within a substrate. A first pair of methods provide for etching through at least a lower thickness of the capping layer with other than a reactive ion etch to provide an exposed conductor contact region. A partially overlapping second pair of methods provides for converting at least an upper thickness of the capping layer to a converted material layer that is removed incident to providing an exposed conductor contact region. As adjunct to any of the methods, a liner layer is formed and located upon the exposed conductor contact region in absence of an undesirable reactive environment.

20 Claims, 3 Drawing Sheets

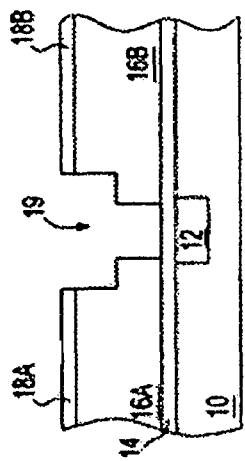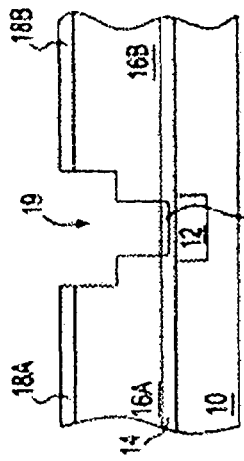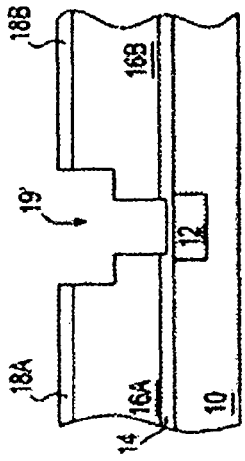
FIG. 1  FIG. 2  FIG. 3
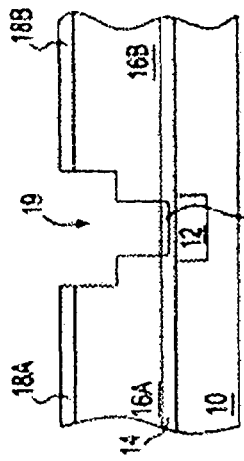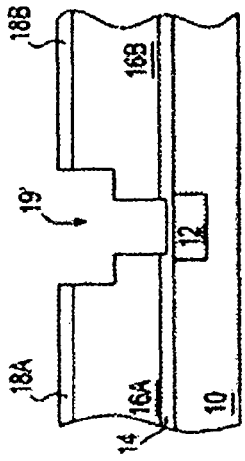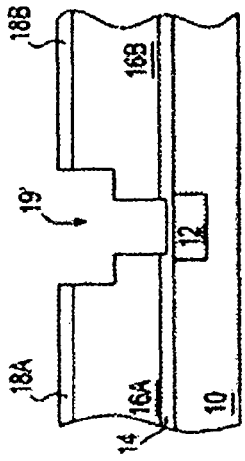
FIG. 4  FIG. 5  FIG. 6

METHOD OF MAKING CONDUCTOR CONTACTS HAVING ENHANCED RELIABILITY

BACKGROUND OF THE INVENTION

1. Field of the Invention

The invention relates generally to conductor contacts within semiconductor and other microelectronic structures. More particularly, the invention typically relates to conductor contacts with enhanced reliability within semiconductor structures, such as interconnect structures.

2. Description of the Related Art

Microelectronics fabrication typically provides for forming microelectronic devices within or upon a substrate. The devices may include semiconductor (i.e., typically active) devices as well as non-semiconductor (i.e., typically passive) devices. The devices are electrically connected and interconnected with patterned conductor layers that are embedded with one or more dielectric layers. These dielectric layers including the embedded conductor features are often referred to in the art as interconnect structures.

Microelectronic circuit performance is often determined not only by device performance characteristics, but also loss factors associated with patterned conductor wiring layers that provide power and signal connections to microelectronic devices. Loss factors, such as resistive losses, often occur at contact regions where patterned conductor layers connect directly to devices, or to each other. To reduce such resistive losses, patterned conductor layers routinely comprise copper materials that are formed using damascene methods, and in particular dual damascene methods.

Dual damascene methods provide for forming a blanket dielectric layer to cover a conductor contact region within a substrate. A via and a contiguous trench are formed into the blanket dielectric layer to provide a point of electrical contact to the conductor contact region. A blanket conductor is formed into the via and the contiguous trench. The structure is planarized to yield a contiguous patterned conductor interconnect and stud layer. Thus, at least one resistive interface between a conductor stud layer and a conductor interconnect layer is eliminated by using a dual damascene method, in comparison with other methods that may be used for forming patterned conductor layers within microelectronic circuits.

Various damascene methods, and permutations thereof, are known in the semiconductor and microelectronic fabrication arts. For example, Tsai et al., in U.S. Pat. No. 6,562,725, teaches a dual damascene method and a dual damascene structure that provide for enhanced manufacturability. The method and the structure use: (1) a first etch stop layer (covering a contact region) comprising one of a silicon carbide material and a nitrogenated silicon carbide material; and (2) a second etch stop layer (interposed between a first dielectric layer and a second dielectric layer) comprising the other of the silicon carbide material and the nitrogenated silicon carbide material.

Conductor contact resistance losses are clearly not totally eliminated by using dual damascene methods and dual damascene structures within semiconductor and microelectronic circuits. Thus, additional methods and structures are clearly desirable to provide conductor contacts with low contact resistance and enhanced reliability.

SUMMARY OF THE INVENTION

The invention provides three methods for fabricating a conductor structure. The conductor structure will generally comprise, but is not limited to: a conductor interconnect structure. The conductor structure is applicable in semiconductor circuits and other microelectronic circuits. A first pair of the three methods provides for using other than a reactive ion etch when etching through at least a lower thickness of a capping layer upon a conductor contact region within a substrate, to provide an exposed conductor contact region within the substrate. A partially overlapping second pair of methods provides for forming a converted material layer from at least an upper thickness of a capping layer upon a conductor contact region within a substrate to facilitate exposing the conductor contact region within the substrate while also using other than a reactive ion etch.

Each of the methods also contemplates forming a liner layer (i.e., typically a conductor liner layer, but the invention does not preclude a dielectric liner layer or a semiconductor liner layer) upon the exposed conductor contact region. Liner layers of other than conductor materials may provide structures other than interconnect structures, within the context of the invention. These other structures may include, but are not limited to: diode structures and anti-fuse structures. The liner layer is formed upon the conductor contact region in absence of an undesirable reactive environment.

In accordance with the foregoing general description of the embodiments of the invention, a first of the three methods (i.e., a first embodiment) includes providing a substrate having a conductor contact region located therein, and a capping layer located upon the conductor contact region. It also includes etching at least a lower thickness of the capping layer located upon the conductor contact region with other than a reactive ion etch to provide an exposed conductor contact region.

Similarly, a second of the three methods (i.e., a second embodiment) includes providing a substrate having a conductor contact region located therein, and a capping layer located upon the conductor contact region. It also includes converting an upper thickness of the capping layer over the conductor contact region to a converted material layer upon a lower thickness of the capping layer upon the conductor contact region. It further includes removing the converted material layer from the lower thickness of the capping layer. Finally, it also includes etching the lower thickness of the capping layer with other than a reactive ion etch to provide an exposed conductor contact region.

Finally a third of the methods (i.e., a third embodiment) includes providing a substrate having a conductor contact region located therein, and a capping layer located upon the conductor contact region. It also includes converting the capping layer upon the conductor contact region to a converted material layer upon the conductor contact region. Finally, it also includes removing the converted material layer upon the conductor contact region with other than a reactive ion etch to provide an exposed conductor contact region.

Subsequent to any one of the three foregoing methods (which yield an analogous, equivalent or identical semiconductor structure or microelectronic structure), a liner layer may be formed in absence of an undesirable reactive environment, and located upon the exposed conductor contact region.

Within the first two of the three methods, at least the lower thickness of the capping layer is preferably etched while using a non-reactive ion sputter etch method within a single reactor chamber that is also used for depositing the liner layer. Alternatively, a multiple chamber system that shares a common vacuum environment and has specialized sputter etch and deposition chambers attached to the common vacuum environment may be used.

Within the last two of the three methods, the converted material layer when comprising an oxidation product of a capping layer comprising a silicon carbide material may be etched within an aqueous hydrofluoric acid etchant (i.e., other than a reactive ion etch) that provides a non-reactive environment with respect to a conductor contact region that comprises a copper conductor material.

Within each of the embodiments and the invention a "reactive ion etch" sought to be avoided is characterized by a chemical etching component that is activated with an intrinsic or extrinsic energy source within a reactor chamber to provide an activated ion chemical etching component. The activated ion chemical etching component typically derives from an etchant gas. Energy sources used for activation may include, but are not limited to: radio frequency plasma sources and substrate bias sources.

Within each of the embodiments of the invention an "undesirable reactive environment" is intended as a reactive environment to which an exposed conductor contact region may be exposed, that will undesirably alter the chemical or electrical properties of the exposed conductor contact region. Non-limiting examples of altered electrical properties will typically include a comparatively higher and undesirable resistance. Non-limiting examples of altered chemical properties will typically include chemical oxidation of the conductor contact region or chemical surface adsorption upon the conductor contact region that impedes further processing with respect to the conductor contact region. Undesirable reactive environments may include, but are not limited to: oxidizing environments and reactive ion etch environments. The embodiments and invention also contemplate the existence of desirable reactive environments, such as but not limited to: inert sputter ion environments and reducing reactive environments that may use hydrogen based reductants.

BRIEF DESCRIPTION OF THE DRAWINGS

The objects, features and advantages of the invention are understood within the context of the Description of the Preferred Embodiments, as set forth below. The Description of the Preferred Embodiments is understood within the context of the accompanying drawings, which form a material part of this disclosure, wherein:

FIG. 1 to FIG. 3 show a series of schematic cross-sectional diagrams illustrating the results of progressive stages of initial processing of a conductor contact structure in accordance with a first embodiment of the invention.

FIG. 4 to FIG. 7 show a series of schematic cross-sectional diagrams illustrating the results of progressive stages of initial processing of a conductor contact structure in accordance with a second embodiment of the invention.

DESCRIPTION OF THE INVENTION

Figure 7:
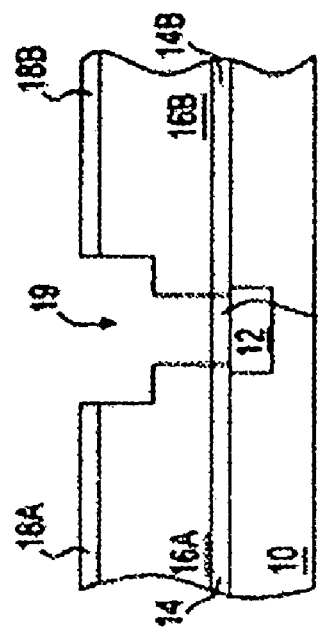

The invention provides several methods (i.e., embodiments) for fabricating a conductor contact structure with enhanced functionality and reliability. To realize the foregoing objects, the embodiments provide for: (1) etching through at least a lower thickness of a capping layer located upon a conductor contact region with other than a reactive ion etch to provide an exposed conductor contact region; and/or (2) converting at least an upper thickness of a capping layer to a converted material layer to facilitate exposing the conductor contact region using other than the reactive ion etch.

Any of the methods further provide for forming a liner layer upon the exposed conductor contact region in absence of an undesirable reactive environment.

FIG. 1 to FIG. 3 show a series of schematic cross-sectional diagrams illustrating the results of progressive initial processing of a conductor contact structure in accordance with a first embodiment of the invention.

FIG. 1 shows a substrate 10 having a conductor contact region 12 located therein. A blanket capping layer 14 is located upon the substrate 10 including the conductor contact region 12. A pair of patterned inter-level dielectric layers 16a and 16b is located upon the blanket capping layer 14. Finally, a pair of patterned hard mask layers 18a and 18b is located aligned upon the pair of patterned inter-level dielectric layers 16a and 16b. The pair of patterned inter-level dielectric layers 16a and 16b, and the pair of patterned hard mask layers 18a and 18b, define a dual damascene aperture 19 that exposes a portion of the blanket capping layer 14 that is located upon the conductor contact region 12.

The substrate 10 and each of the foregoing layers located thereupon or thereover as illustrated in FIG. 1 may comprise materials and have dimensions that are conventional in the microelectronic fabrication art, including, in particular, the semiconductor fabrication art. In addition, each of the substrate 10 and the foregoing layers may also be formed using methods that are conventional in the foregoing arts.

For example, the substrate 10 may comprise a substrate including but not limited to: a semiconductor substrate, a ceramic substrate, a flat panel substrate or a solar cell substrate. Typically the substrate 10 comprises a semiconductor substrate. When the substrate 10 comprises a semiconductor substrate, the semiconductor substrate may comprise semiconductor materials including, but not limited to: silicon, germanium, silicon germanium alloy, silicon carbide, silicon germanium carbide alloy and compound (i.e., II-VI and III-V) semiconductor materials. Non-limiting examples of compound semiconductor materials include gallium arsenide, indium arsenide and indium phosphide semiconductor materials.

Within the instant embodiment, the substrate 10 typically comprises a silicon or silicon-germanium alloy semiconductor material having semiconductor devices located therein and thereupon. In addition, the substrate 10 will typically also comprise a series of patterned conductor layers in addition to the conductor contact region 12. The series of patterned conductor layers is typically separated by a series of dielectric layers that also typically comprise the substrate 10. The additional series of patterned conductor layers may comprise conductor materials that have dimensions and are formed using methods analogous, equivalent or identical to those disclosed below with respect to the conductor contact region 12. Additionally, the series of patterned dielectric layers may comprise materials that have dimensions and are formed using methods analogous, equivalent or identical to those disclosed below with respect to the pair of patterned inter-level dielectric layers 16a and 16b.

The conductor contact region 12 may comprise any of several conductor materials that are conventional in the art. Such conductor materials may include, but are not limited to: highly doped polysilicon (i.e., from about 1e20 to about 11e22 dopant atoms per cubic centimeter), metal, metal alloy, metal nitride, metal silicide and polycide (i.e., doped polysilicon/metal silicide stack) conductor materials; as well as composites thereof and laminates thereof. Typically, the conductor contact region 12 comprises a patterned conductor layer. In turn, the patterned conductor layer typically comprises a metal, such as, but not limited to: a copper or an aluminum metal. Typically the patterned conductor layer comprises copper and has a thickness from about 2000 to about 5000 angstroms.

The conductor contact region 12 may be formed using any of several methods. Non-limiting examples of the methods include chemical vapor deposition methods, physical vapor deposition methods, electrochemical plating methods, thermal annealing methods and planarizing methods.

The blanket capping layer 14 is intended to cap the conductor contact region 12, and also typically serve as an etch stop when forming the dual damascene aperture 19 within a blanket inter-level dielectric layer from which is patterned the pair of patterned inter-level dielectric layers 16a and 16b. Thus, the blanket capping layer 14 will typically have etch stop properties in addition to barrier properties. Non-limiting examples of etch stop materials include nitride, oxynitride and carbide materials. Typically, the blanket capping layer 14 comprises a silicon carbide material such as, but not limited to: a hydrogenated silicon carbide material (i.e., SiCH) or a nitrogenated and hydrogenated silicon carbide material (i.e., SiCHN). Such a blanket capping layer typically has a thickness from about 350 to about 500 angstroms. The blanket capping layer 14 is typically formed using a chemical vapor deposition method that, in turn, uses suitable silicon, carbon, hydrogen and nitrogen source materials. Silane, methane, nitrogen, trimethyl-silane, trtramethyl-silane, and ammonia may be typical source materials. Other deposition methods and source materials may also be used.

The pair of patterned inter-level dielectric layers 16a and 16b may also comprise inter-level dielectric materials that are conventional in the semiconductor and microelectronic fabrication arts. Non-limiting examples of such dielectric materials include silicon oxide dielectric materials, silicon nitride and silicon oxynitride dielectric materials having a dielectric constant from about 4 to about 20, measured in vacuum. Also, and preferably, the pair of patterned inter-level dielectric layers 16a and 16b may comprise generally lower dielectric constant dielectric materials having a dielectric constant of less than 4, typically from about 2 to about 4, measured in vacuum. Non-limiting examples of such lower dielectric constant dielectric materials include spin-on-glass (SOG) materials, aerogels, organic polymer materials, silicon carbide materials especially hydrogenated silicon oxycarbide materials (SiCOH) and doped silicate glass (hydrogen, carbon, fluorine dopants) materials. The dielectric materials may be porous, non-porous or a combination thereof. Typically, each of the pair of patterned inter-level dielectric layers 16a and 16b has a thickness from about 1000 to about 6000 angstroms. Each of the pair of patterned inter-level dielectric layers 16a and 16b may be formed using methods that are conventional in the art. The methods will often be specific to the materials. Non-limiting examples of methods include spin coating methods, chemical vapor deposition methods and physical vapor deposition methods.

Typically, each of the pair of patterned inter-level dielectric layers 16a and 16b comprises an oxidized hydrogen doped silicon carbide dielectric material (i.e., SiCOH) and has a thickness from about 2000 to about 5000 angstroms. The oxidized hydrogen doped silicon carbide material is generally formed using a chemical vapor deposition method. Other methods such as, for example, plasma enhanced chemical vapor deposition, may be used. Different deposition methods will often provide a deposited SiCOH dielectric material with somewhat different chemical compositions and physical properties. Typical chemical compositions (atomic percent) for SiCOH dielectric materials are: silicon about 0.09 to about 0.22; carbon about 0.15 to about 0.30; oxygen about 0.20 to about 0.40 and hydrogen about 0.20 to about 0.50. Chemical compositions may be measured using Rutherford backscattering techniques, as well as other techniques.

Finally, the pair of patterned hard mask layers 18a and 18b typically comprises a hard mask material. Hard mask materials may in general include, but are not limited to: oxide, nitride and oxynitride dielectric materials, although semiconductor hard mask materials and conductor hard mask materials are not excluded. Each of the pair of patterned hard mask layers 18a and 18b typically has a thickness from about 350 to about 1000 angstroms. The pair of patterned hard mask layers 18a and 18b may be formed using methods including, but not limited to: chemical vapor deposition methods and physical vapor deposition methods.

Typically, the pair of patterned hard mask layers 18a and 18b is formed of a silicon oxide material that has a thickness from about 500 to about 1000 angstroms. Preferably, the silicon oxide material is deposited using a chemical vapor deposition method that in turn uses a tetraethylorthosilicate (TEOS) silicon source material. Other hard mask materials may alternatively be used.

The dual damascene aperture 19 that is defined primarily by the pair of patterned inter-level dielectric layers 16a and 16b may be formed using any of several process sequences. Two primary variants of process sequences are: (1) a via first and then a trench; and (2) a trench first and then a via. Either of the foregoing process sequences, or any of several other process sequences that yield the dual damascene aperture 19 that is illustrated in FIG. 1, may also be used. Similarly, while the instant embodiment that is illustrated in FIG. 1 shows the dual damascene aperture 19 bounded by the pair of inter-level dielectric layers 16a and 16b absent an intermediate etch stop layer, that too does not limit the instant embodiment or the invention.

Rather, the instant embodiment and the invention are also applicable with a dual damascene aperture that comprises and uses an intermediate etch stop layer interposed between a via defining portion and a trench defining portion of an inter-metal dielectric layer, such as the pair of patterned inter-metal dielectric layers 16a and 16b.

Finally, although the schematic cross-sectional diagram of FIG. 1 illustrates a dual damascene aperture 19 having at its base an exposed portion of a blanket capping layer 14 above a conductor contact region 12, neither the instant embodiment nor the invention is particularly limited to a structure incorporating such a dual damascene aperture. Rather, the instant embodiment and the invention are applicable within the context of: (1) damascene structures including, but not limited to: single damascene structures and dual damascene structures; as well as (2) non-damascene structures. Most generally, the embodiments and the invention are directed towards removing a capping layer (such as capping layer 14) from a conductor contact region (such as conductor contact region 12) so that a functional and reliable connection may be made to the exposed conductor contact region.

In accordance with the above, the instant embodiment and the invention are thus directed towards the goal of patterning the capping layer 14 to yield a pair of patterned capping layers and an exposed conductor contact region 12. The instant embodiment and the invention are intended to effect the foregoing patterning in a fashion that minimizes any detrimental impact to the exposed conductor contact region 12. Detrimental impact may result from a reactive ion etch process that may be used for etching through the blanket capping layer 14 when forming therefrom the pair of patterned capping layers. Such a reactive ion etch process will typically use a carbon and fluorine containing etchant gas composition when the blanket capping layer 14 comprises a silicon containing dielectric material, such as a preferred silicon carbide dielectric material. Using such a carbon and fluorine containing etchant gas composition may yield corrosive fluorine containing residue materials upon the conductor contact region 12 incident to use of the reactive ion etch method.

The invention comprises a minimum of three different methods for penetrating through and patterning the blanket capping layer 14. They are discussed within the context of three embodiments, each one of which starts with a microelectronic structure analogous, equivalent or identical to the microelectronic structure illustrated in FIG. 1.

FIG. 2 shows the results of the next process step in accordance with the first embodiment of the invention.

FIG. 2 shows a thinned blanket capping layer 14' located interposed between the substrate 10 and the pair of patterned inter-level dielectric layers 16a and 16b at the base of an extended dual damascene aperture 19'. The thinned blanket capping layer 14' results from thinning of the blanket capping layer 14 at a location above the conductor contact region 12. In general, such a thinning is optional within the invention, and may be avoided when the blanket capping layer 14 itself has a limited thickness (i.e., from about 50 to about 100 angstroms).

The first embodiment provides that the thinning of the blanket capping layer 14 to provide the thinned blanket capping layer 14' may be effected using any of several etch methods, including reactive ion etch methods, that are appropriate for the capping material that comprises that blanket capping layer 14. When the blanket capping layer 14 comprises a silicon containing dielectric material such as the preferred silicon carbide dielectric material, the blanket capping layer 14 is etched and thinned over the conductor contact region 12 while using a reactive ion etch method that uses a fluorine containing etchant gas composition that typically comprises a carbon and fluorine containing etchant gas. The blanket capping layer 14 is etched and thinned to leave remaining from about 50 to about 150 angstroms thickness within the thinned blanket capping layer 14' upon the conductor contact region 12.

FIG. 3 illustrates the results of further processing of the microelectronic structure of FIG. 2.

FIG. 3 illustrates the results of etching completely through the thinned blanket capping layer 14' to reach and expose the conductor contact region 12 at the base of a completed dual damascene aperture 19". As a result of exposing the conductor contact region 12, a pair of patterned capping layers 14a and 14b is thus formed from the thinned blanket capping layer 14'.

Within the first embodiment, the complete etching of the thinned blanket capping layer 14' to yield the pair of patterned capping layers 14a and 14b and the exposed conductor contact region 12 is undertaken using other than a reactive ion etch. To that end, etching of the thinned blanket capping layer 14' to yield the pair of patterned capping layers 14a and 14b is preferably undertaken in a deposition tool subsequently used for depositing a liner layer upon the microelectronic structure whose schematic cross-sectional diagram is illustrated in FIG. 3. Preferably, the thinned blanket capping layer 14' is etched to form the pair of patterned capping layers 14a and 14b while using an unreactive ion etch method, such as, but not limited to: a sputter etch method. The sputter etch method may also be used to clean the surface of the conductor contact region 12 after patterning the thinned blanket capping layer 14'. An inert sputtering gas is used in the method. Typical inert sputtering gases include helium, neon, argon, krypton and xenon.

FIG. 1 to FIG. 3 show a series of schematic cross-sectional diagrams illustrating the results of progressive process steps in exposing a conductor contact region 12 in accordance with a first embodiment of the invention. The first embodiment provides for an optional thinning of a blanket capping layer 14 to provide a thinned blanket capping layer 14' prior to etching completely through the thinned blanket capping layer 14' to provide a pair of patterned capping layers 14a and 14b that expose the conductor contact region 12. The etching of the thinned blanket capping layer 14' to yield the pair of patterned capping layers 14a and 14b is undertaken using other than a reactive ion etch, and preferably using a non-reactive ion sputter etch absent atmospheric exposure, and typically within a reactor chamber within a liner layer deposition tool used for depositing a liner layer upon the exposed conductor contact region 12.

The use of other than the reactive ion etch, and preferably the non-reactive ion sputter etch, provides for a conductor contact region to which a functional and reliable connection may be made.

FIG. 4 to FIG. 7 show a series of schematic cross-sectional diagrams illustrating a second embodiment of the invention that also etches the blanket capping layer 14 to expose the conductor contact region 12 located thereunder.

In a first instance, FIG. 4 shows a schematic cross-sectional diagram of a microelectronic structure analogous, equivalent or identical to the microelectronic structure whose schematic cross-sectional diagram is illustrated in FIG. 1. Like or identical components are designated with identical reference numerals.

FIG. 5 shows the results of partially converting (rather than partially etching) an upper thickness of the blanket capping layer 14 over the conductor contact region 12 to also form the thinned blanket capping layer 14'. In comparison with FIG. 2, however, a converted material layer 15 is located upon the thinned blanket capping layer 14' over the conductor contact region 12.

Within the second embodiment as illustrated in FIG. 5, the converted material layer 15 is intended to have a composition that provides an enhanced susceptibility to etching in an etchant that does not otherwise readily etch the material which comprises the thinned blanket capping layer 14'. Thus, the second embodiment requires a matching of a material composition for the blanket capping layer 14 with a material modification of that material composition, along with an enhanced susceptibility of the modified material to etch within a particular etchant. As long as the foregoing conditions are met, the second embodiment does not in particular specify any required capping layer material or etchant.

From a practical point of view, silicon containing dielectric materials with enhanced oxygen content (i.e., silicon oxide like materials) have a tendency towards enhanced etch rates in aqueous hydrofluoric acid etchants. In comparison, silicon containing dielectric materials with enhanced nitrogen content (i.e., silicon nitride like materials) have a tendency towards enhanced etch rates in aqueous phosphoric acid etchants.

Thus, within the second embodiment when: (1) the blanket capping layer comprises a silicon carbide material, such as a hydrogenated or a nitrogenated and hydrogenated silicon carbide material (i.e., SiCH or SiCHN); and (2) the pair of patterned inter-level dielectric layers 16a and 16b comprises a partially oxidized hydrogenated silicon carbide material (i.e., SiCOH, alternatively characterized as a carbon and hydrogen doped silicon oxide material) two fundamental options exist for converting a portion of the blanket capping layer 14 when forming the converted material layer 15. First, the converted material layer 15 may comprise a highly nitrogenated silicon carbide material having a functional etch rate within an aqueous phosphoric acid etchant. Alternatively, the converted material layer 15 may comprise a highly oxidized silicon carbide material or nitrogenated silicon carbide material having a higher etch rate in a hydrofluoric acid etchant than the pair of patterned inter-level dielectric layers 16a and 16b when comprising a less oxidized hydrogenated silicon carbide material. The foregoing latter option (i.e., oxidation) is preferred within the second embodiment.

To achieve substantial oxidation of the blanket capping layer 14 in the presence of the pair of patterned inter-level dielectric layers 16a and 16b, an ion implantation and annealing of oxygen may be used, or alternatively a substrate biased oxygen reactive ion plasma may be used.

Typically the converted material layer 15 has a thickness from about 150 to about 250 angstroms. Analogously with the first embodiment of the invention, the thinned blanket capping layer 14' has a thinned remaining (i.e., lower) thickness from about 50 to about 150 angstroms upon the conductor contact region 12.

FIG. 6 shows the results of stripping the converted material layer 15 from the thinned blanket capping layer 14' to provide a microelectronic structure analogous, equivalent or identical to the microelectronic structure illustrated in FIG. 2.

In accordance with description above, the converted material layer 15 may be stripped using wet chemical methods. However, the second embodiment does not preclude use of dry plasma etch methods and aggregate wet chemical and dry plasma methods.

FIG. 7 corresponds with FIG. 3. FIG. 7 also shows the results of etching through the thinned blanket capping layer 14' at the location above the conductor contact region 12 to yield a pair of patterned capping layers 14a and 14b that expose the conductor contact region 12 at the base of the completed dual damascene aperture 19".

FIG. 4 to FIG. 7 show a series of schematic cross-sectional diagrams illustrating the results of progressive stages in fabricating a conductor contact structure in accordance with a second embodiment of the invention. The second embodiment provides for converting an upper thickness of the blanket capping layer 14 over a conductor contact region 12 to yield a converted material layer 15. The converted material layer 15 is stripped from the resulting thinned blanket capping layer 14' and the thinned portion of the thinned blanket capping layer 14' is etched while using other than a reactive ion etch to provide a pair of patterned capping layers 14a and 14b that expose the conductor contact region 12.

Figure 8:
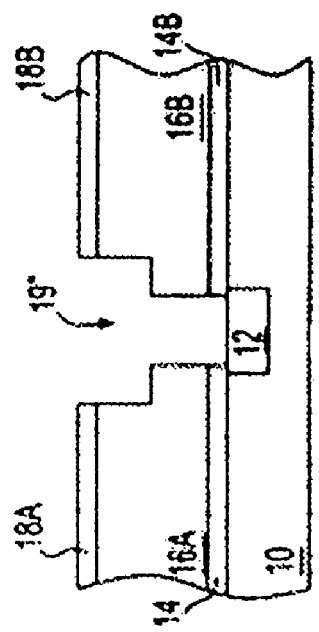
FIG. 8 to FIG. 10 show a series of schematic cross-sectional diagrams illustrating the results of progressive stages of initial processing of a conductor contact structure in accordance with a third embodiment of the invention.
Figure 9:
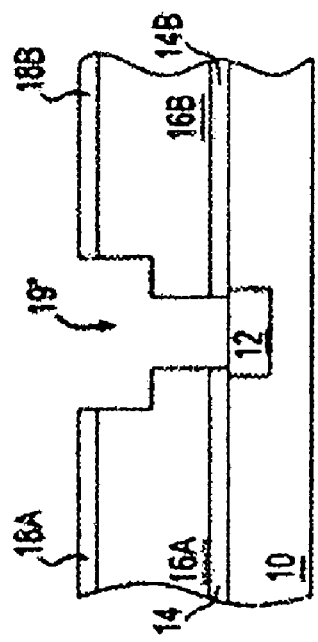
Figure 10:
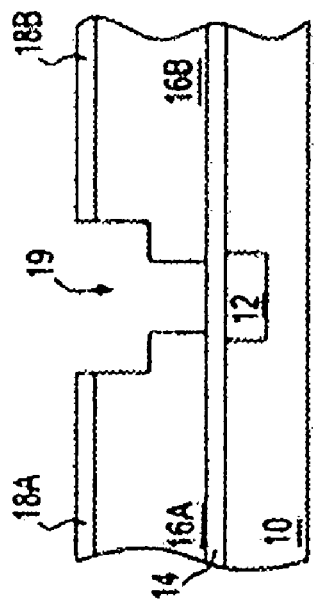

FIG. 8 to FIG. 10 show a series of schematic cross-sectional diagrams illustrating the results of progressive stages in fabricating a conductor contact structure in accordance with a third embodiment of the invention.

FIG. 8 is analogous, equivalent or identical to FIG. 4 or FIG. 1, and again identical reference numerals are used for like or identical structures.

As illustrated in FIG. 9, the third embodiment contemplates that the blanket capping layer 14 as illustrated in FIG. 8 is completely converted at the base of the dual damascene aperture 19 to provide a converted material layer 15', as well as the pair of patterned capping layers 14a and 14b. The converted material layer 15' is converted for its entire thickness and it reaches the conductor contact region 12.

FIG. 10 shows the results of stripping the converted material layer 15' to expose the conductor contact region 12. The converted material layer 15' as illustrated in FIG. 9 may be stripped using methods and materials analogous, equivalent or identical to the methods and materials used for stripping the converted material layer 15 as illustrated in FIG. 5, provided that the methods are not reactive ion etch methods. Thus, wet chemical etch methods (such as the preferred aqueous hydrofluoric acid etch for a converted material layer 15' formed by oxidation) and non-reactive ion etch methods are common.

FIG. 8 to FIG. 10 show a series of schematic cross-sectional diagrams illustrating the results of progressive stages of fabricating a conductor contact structure in accordance with a third embodiment of the invention.

The third embodiment provides for a total conversion of a thickness of a blanket capping layer 14 upon a conductor contact region 12 to yield a converted material layer 15' that is readily stripped from the conductor contact region 12 using other than a reactive ion etch.

FIG. 11 to FIG. 14 show a series of schematic cross-sectional diagrams illustrating the results of further processing of the microelectronic structures that are illustrated in FIG. 3, FIG. 7 and FIG. 10.

Figure 11:
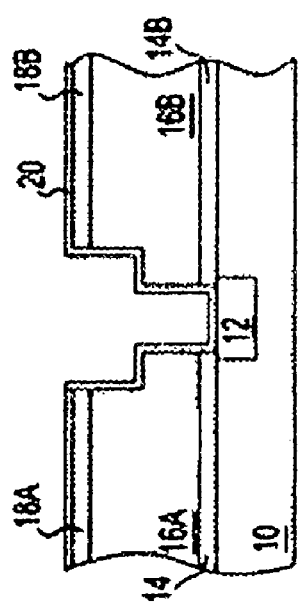
FIG. 11 to FIG. 14 show a series of schematic cross-sectional diagrams illustrating the results of progressive final processing of a conductor contact structure in accordance with either the first embodiment, the second embodiment or the third embodiment of the invention.

FIG. 11 shows a blanket liner layer 20 located within the completed dual damascene aperture 19" as illustrated in FIG. 10 and bridging to the pair of patterned hard mask layers 18a and 18b, and in particular contacting the conductor contact region 12. Within the first embodiment as illustrated in FIG. 1 to FIG. 3 and the second embodiment as illustrated in FIG. 4 to FIG. 7, the blanket liner layer 20 is deposited upon either of the schematic cross-sectional diagrams of FIG. 3 or FIG. 7 in the same chamber within which either a complete thickness of the blanket capping layer 14 or a partial lower thickness of the thinned blanket capping layer 14' is etched. Removal of the thickness of the blanket capping layer 14 or the partially thinned blanket capping layer 14' is effected while using other than a reactive ion etch.

Typically, the other than reactive ion etch is a non-reactive ion physical sputter etch that may also be used to sputter etch clean the surface of the conductor contact region 12. In accordance with the third embodiment of the invention as disclosed in conjunction with FIG. 8 to FIG. 10, wet chemical etch methods are also not excluded when removing a converted material layer 15' to expose the conductor contact region 12.

Within any of the three embodiments of the invention, the blanket liner layer 20 may comprise a conductor material, a dielectric material or a semiconductor material, although a conductor material is most common. The blanket liner layer 20 is intended to have barrier properties with respect to the dielectric material which comprises the pair of patterned inter-level dielectric layers 16a and 16b, and a conductor material subsequently located upon the blanket liner layer 20. Non-limiting examples of conductor barrier materials include titanium, tantalum and tungsten metals, nitrides thereof and silicides thereof, as well as composites thereof and laminates thereof. Any of the foregoing materials may be deposited using methods conventional in the art. The methods may include, but are not limited to: chemical vapor deposition methods, physical vapor deposition methods, thermal annealing methods, ion implantation methods, atomic layer deposition methods, and plasma treatment methods. Within any of the embodiments of the invention, the blanket liner layer 20 preferably comprises a tantalum/tantalum nitride layered laminate having a total thickness from about 1000 to about 1500 angstroms. The blanket liner layer 20 is typically deposited using a physical vapor deposition sputtering and nitrogen plasma annealing method. Other methods may also be used.

Figure 12:
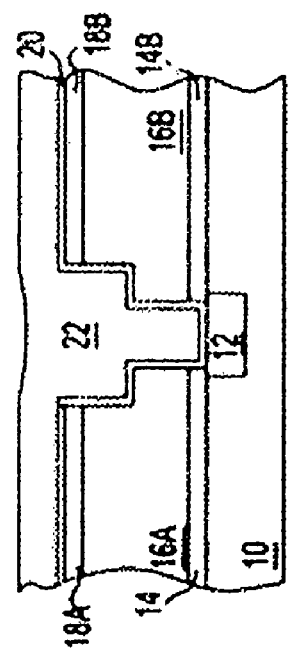

FIG. 12 shows a blanket conductor layer 22 located upon the blanket liner layer 20. The blanket conductor layer 22 may comprise any of several conductor materials that are conventional in the microelectronic fabrication art. Typically, these will include metals such as but not limited to: aluminum and copper, but copper is particularly common and most intended within the invention and all embodiments thereof. Typically the blanket conductor layer 22 has a thickness from about 5000 to about 20000 angstroms. The blanket conductor layer 22 may be deposited using any of several methods. Non-limiting examples include chemical vapor deposition methods, physical vapor deposition methods and plating methods. When the blanket conductor layer 22 comprises a copper material, it is quite common to deposit the same using a plating method.

Figure 13:
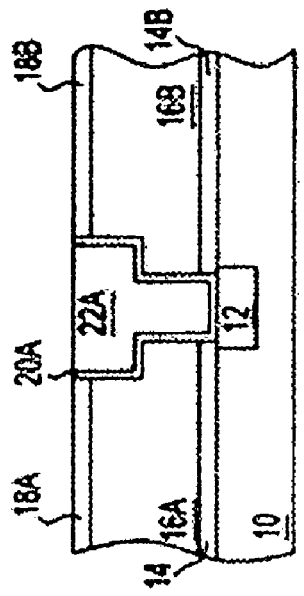

FIG. 13 shows a patterned conductor layer 22a located upon a patterned liner layer 20a in turn located upon the conductor contact region 12 within the completed dual damascene aperture 19″ as illustrated in FIG. 11. The patterned conductor layer 22a and the patterned liner layer 20a result from sequentially planarizing the blanket conductor layer 22 and the blanket liner layer 20, while using the pair of patterned hard mask layers 18a and 18b as a planarizing stop layer. The planarizing may be effected using planarizing methods that are conventional in the art. The planarizing methods may include, but are not limited to: purely mechanical planarizing methods, as well as chemical mechanical polish planarizing methods. Chemical mechanical polish planarizing methods are generally more common.

Figure 14:
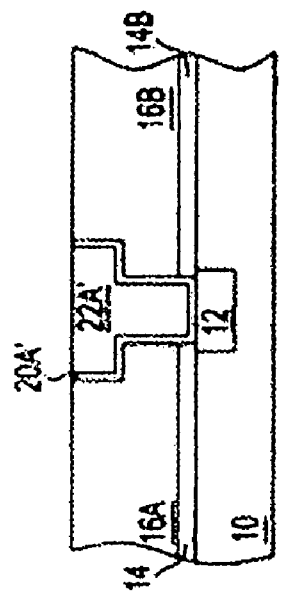

FIG. 14 shows a microelectronic structure corresponding with FIG. 13, but absent the pair of patterned hard mask layers 18a and 18b and with a further planarized patterned conductor layer 22a' located upon a further planarized patterned liner layer 20a'. The pair of patterned hard mask layers 18a and 18b may be stripped from the pair of patterned inter-level dielectric layers 16a and 16b while using methods that are conventional in the art. The methods may include, but are not limited to: chemical mechanical polish methods, dry plasma methods, wet chemical methods and aggregate methods thereof. When the pair of patterned hard mask layers 18a and 18b comprises an appropriate hard mask material, they are often easily stripped using a chemical mechanical polish over polishing step designed to polish both a pertinent conductor material and pertinent hardmask material at the same rate, but not polish an inter-level dielectric material located beneath the hardmask at a significant rate.

Within the context of the instant embodiment, such a materials choice leads to coplanarity of the pair of patterned inter-level dielectric layers 16a and 16b, the further planarized patterned liner layer 20a' and the further planarized patterned conductor layer 22a'.

FIG. 14 shows a schematic cross-sectional diagram of a microelectronic structure that results from fabrication process sequences in accordance with all of the embodiments of the invention. The fabrication process sequences provide several alternative process steps for exposing a conductor contact region 12 located beneath a blanket capping layer 14 while avoiding exposure of the conductor contact region 12 to a reactive ion etch.

In a first embodiment and a second embodiment, the invention realizes the foregoing object by etching at least a lower thickness of the blanket capping layer 14 within a reactor chamber within a deposition apparatus within which is deposited a liner layer 20 that contacts the conductor contact region 12. At least the lower thickness is etched using other than a reactive ion etch, and preferably a non-reactive ion sputter etch.

In a second embodiment and in a third embodiment, at least an upper thickness of the blanket capping layer 14 over a conductor contact region 12 is converted to a converted material layer that is also susceptible to etching using other than a reactive ion etch. At least the upper thickness is typically etched using a wet chemical etch, although the invention is not so limited.

The preferred embodiments of the invention are illustrative of the invention rather than limiting of the invention. Revisions and modifications may be made to methods, materials, structures and dimensions in accordance with the preferred embodiments of the invention, while still providing embodiments in accordance with the invention, further in accordance with the accompanying claims.

What is claimed is:

1. A method for fabricating a conductor structure comprising:
    providing a substrate having a conductor contact region located therein, and a capping layer located upon the conductor contact region;
    etching an upper thickness of the capping layer located upon the conductor contact region with a reactive ion etch to leave remaining a lower thickness of the capping layer located upon the conductor contact region; and
    etching the lower thickness of the capping layer located upon the conductor contact region with a non-reactive ion etch to provide an exposed conductor contact region.

2. The method of claim 1 further comprising:
    forming a liner layer upon the exposed conductor contact region absent exposure of the exposed conductor contact region to an undesirable reactive environment.

3. The method of claim 2 wherein:
    the etching of at least the lower thickness of the capping layer to provide the exposed conductor contact region; and
    the forming of the liner layer upon the exposed conductor contact region, are both undertaken in a single reactor chamber absent the undesirable reactive environment.

4. The method of claim 1 wherein the substrate comprises a semiconductor substrate.

5. The method of claim 1 wherein the conductor contact region comprises a copper material.

6. The method of claim 1 wherein the capping layer comprises a silicon carbide material.

7. The method of claim 1 wherein only the lower thickness of the capping layer located upon the conductor contact region is etched with a non-reactive ion sputter etch method to provide the exposed conductor contact region.

8. The method of claim 1 wherein the capping layer consists of a single layer.

9. A method for forming a conductor structure comprising:
    providing a substrate having a conductor contact region located therein, and a capping layer located upon the conductor contact region;
    converting an upper thickness of the capping layer over the conductor contact region to a converted material layer upon a lower thickness of the capping layer upon the conductor contact region;
    removing the converted material layer from the lower thickness of the capping layer; and
    etching the lower thickness of the capping layer with a non-reactive ion etch to provide an exposed conductor contact region.

10. The method of claim 9 further comprising:
forming a liner layer upon the exposed conductor contact region absent exposure of the exposed conductor contact region to an undesirable reactive environment.

11. The method of claim 10 wherein:
the etching of at least the lower thickness of the capping layer to provide the exposed conductor contact region; and
the forming of the liner layer upon the exposed conductor contact region, are both undertaken in a single reactor chamber absent the undesirable reactive environment.

12. The method of claim 9 wherein the substrate comprises a semiconductor substrate.

13. The method of claim 9 wherein the conductor contact region comprises a copper material.

14. The method of claim 9 wherein the capping layer comprises a silicon carbide material.

15. The method of claim 14 wherein:
the converted material layer comprises an oxidized silicon carbide material; and
the converted material layer is removed using an aqueous hydrofluoric acid etchant.

16. A method for forming a conductor structure comprising:
providing a substrate having a conductor contact region located therein, and a capping layer located upon the conductor contact region;
converting the capping layer upon the conductor contact region to a converted material layer upon the conductor contact region; and
removing the converted material layer upon the conductor contact region with a non-reactive ion etch to provide an exposed conductor contact region.

17. The method of claim 16 further comprising:
forming a liner layer upon the exposed conductor contact region.

18. The method of claim 16 wherein the capping layer comprises a silicon carbide material.

19. The method of claim 18 wherein the converted material layer comprises an oxidized silicon carbide material.

20. The method of claim 19 wherein the converted material layer is removed using an aqueous hydrofluoric acid etchant.

* * * * *